United States Patent
Fujii et al.

(10) Patent No.: US 9,821,935 B2
(45) Date of Patent: Nov. 21, 2017

(54) FIXING STRUCTURE

(71) Applicant: FUJITSU TEN LIMITED, Kobe-shi, Hyogo (JP)

(72) Inventors: Toshihiko Fujii, Kobe (JP); Yasuaki Takeda, Kobe (JP)

(73) Assignee: FUJITSU TEN LIMITED, Kobe (JP)

( * ) Notice: Subject to any disclaimer, the term of this patent is extended or adjusted under 35 U.S.C. 154(b) by 0 days.

(21) Appl. No.: 15/052,101

(22) Filed: Feb. 24, 2016

(65) Prior Publication Data
US 2016/0295724 A1    Oct. 6, 2016

(30) Foreign Application Priority Data

Mar. 30, 2015    (JP) .................. 2015-068020

(51) Int. Cl.
| | |
|---|---|
| *H05K 1/18* | (2006.01) |
| *B65D 85/00* | (2006.01) |
| *B65D 43/02* | (2006.01) |
| *H05K 5/00* | (2006.01) |

(52) U.S. Cl.
CPC ....... *B65D 43/0233* (2013.01); *H05K 5/0013* (2013.01); *H05K 5/0052* (2013.01)

(58) Field of Classification Search
CPC . B65D 43/0233; H05K 5/0013; H05K 5/0052
USPC ......... 206/1.5, 701, 706, 723; 220/324, 326, 220/345.1, 345.3, 348, 833–835; 361/679.01, 748, 752, 641
See application file for complete search history.

(56) References Cited

U.S. PATENT DOCUMENTS

| | | | | |
|---|---|---|---|---|
| 4,453,646 A | * | 6/1984 | Harrild | B65D 17/163 220/258.5 |
| 4,881,658 A | * | 11/1989 | VanCucha | B65D 43/0212 220/792 |
| 4,995,513 A | * | 2/1991 | Rosler | B25H 3/003 206/379 |
| 5,574,254 A | * | 11/1996 | Mori | H02G 3/088 174/561 |
| 5,577,779 A | * | 11/1996 | Dangel | E05C 19/06 220/326 |
| 5,931,514 A | * | 8/1999 | Chung | F16B 12/26 220/326 |
| 6,318,585 B1 | * | 11/2001 | Asagiri | B60R 22/34 220/326 |
| 8,459,486 B2 | * | 6/2013 | Luburic | B65D 43/026 220/276 |
| 8,714,394 B2 | * | 5/2014 | Wulf | B65D 43/0212 220/318 |
| 2013/0092692 A1 | * | 4/2013 | Tejima | G05G 1/10 220/326 |

FOREIGN PATENT DOCUMENTS

| | | |
|---|---|---|
| JP | 2006-341668 A | 12/2006 |
| JP | 2010-052715 A | 3/2010 |
| JP | 2014-093310 A | 5/2014 |
| JP | 2014-212608 A | 11/2014 |
| WO | 2007/113932 A1 | 10/2007 |

* cited by examiner

*Primary Examiner* — Luan K Bui
(74) *Attorney, Agent, or Firm* — Oliff PLC (57) ABSTRACT

In a state where an engaging tab and a tab receiver are engaged with each other, the engaging tab is elastically deformed and thus a first end of a second portion applies a force to the tab receiver, the force applied toward a first side of a case.

8 Claims, 7 Drawing Sheets

FIXING STRUCTURE

BACKGROUND OF THE INVENTION

Field of the Invention

The invention relates to a fixing structure for fixing a case and a lid to each other.

Description of the Background Art

A fixing structure for protecting a printed circuit board (PCB) and the like in a metal case, from, for example, impacts, by covering the case with a lid, is well known.

This fixing structure includes a reversed "L"-shaped engaging tab on the lid. The case and a lid are fixed to each other by engaging the engaging tab on the lid with a tab receiver on the case. When being engaged with the tab receiver, the engaging tab is bent and reaction force is generated. The reaction force generated by bend of the engaging tab prevents the lid from coming loose from the case. Thus, looseness between the case and the lid can be prevented.

However, when the reversed "L"-shaped engaging tab is bent, pressure is concentrated on a root portion of the tab and the reversed "L"-shaped engaging tab may be broken in the root portion. If the engaging tab is broken, the lid fixed to the case may come loose so that looseness may occur.

SUMMARY OF THE INVENTION

According to one aspect of the invention, a fixing structure comprising: a case having an aperture on a first side of the case; a lid configured to cover the aperture; an engaging tab provided on the lid; and a tab receiver that detachably engages with the engaging tab, the tab receiver provided on a surface of the case that is substantially orthogonal to the aperture of the case. The engaging tab includes: a first portion having a first end fixed to the lid, the first portion extending substantially orthogonal to the aperture of the case to a second end of the first portion; a second portion having a first end that is spaced from and not fixed to the lid, the second portion extending substantially parallel to the first portion to a second end of the second portion; and a connecting portion that connects the second end of the first portion to the second end of the second portion. In a state where the engaging tab and the tab receiver are engaged with each other, the engaging tab is elastically deformed and thus the first end of the second portion applies a force to the tab receiver, the force applied toward the first side of the case.

Since the engaging tab includes the first portion, the second portion and the connecting portion, the entire engaging tab is elastically deformed easily. Due to elastic deformation of the engaging tab, the case and the lid are fixed to each other.

According to another aspect of the invention, the engaging tab includes an aperture, and in the state where the engaging tab and the tab receiver are engaged with each other, an inside surface of the aperture adjacent to the first end of the second portion applies the force to the tab receiver.

Due to the elastic deformation of the engaging tab, since the inside surface of the aperture of the engaging tab applies the force to the tab receiver, in the state where the engaging tab and the tab receiver are engaged with each other, the case and the lid can be fixed to each other tightly.

Therefore, an object of the invention is to provide a technology for fixing a case and a lid tightly without breakage of an engaging tab easily even if the engaging tab is bent.

These and other objects, features, aspects and advantages of the invention will become more apparent from the following detailed description of the invention when taken in conjunction with the accompanying drawings.

DESCRIPTION OF THE EMBODIMENTS

An embodiment of the invention is described below with reference to the drawings.

1. Embodiment

<1-1. Outline>

Figure 1:
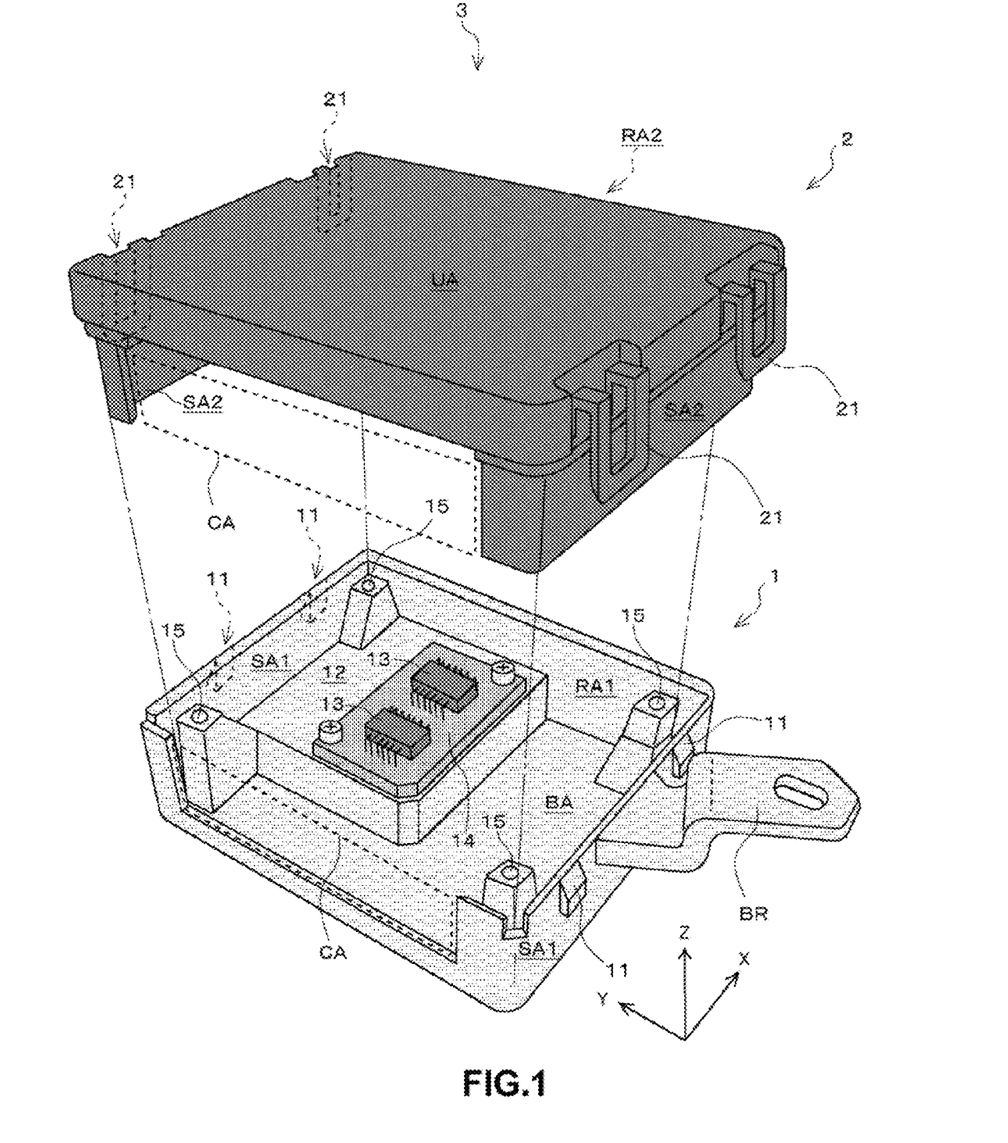
FIG. 1 illustrates an outline of a fixing structure of this embodiment.

FIG. 1 illustrates an outline of a fixing structure for fixing a case 1 and a lid 2 to each other. The case 1 and the lid 2 are fixed to each other and function as a housing 3 including a printed circuit board (PCB) 14. The housing 3 is connected to a controlled object with a connector through a connector opening CA, and thus the housing 3 functions as an electronic controller. The housing 3 is fixed inside a vehicle, such as a car, with a bracket BR and the like and controls a powered steering wheel, airbags, a fuel injection valve of an internal combustion engine, etc.

In the description below, 3D Cartesian coordinates in FIG. 1 are used to show directions and orientations in the description of the embodiment of the invention. The Cartesian coordinates are fixed relative to the housing 3 (the case 1 and the lid 2). An X-axis direction is a backward direction of the housing 3 (a direction from an outside of the housing 3 to the connector opening CA). A Y-axis direction is a left side of the housing 3 (a left side of the connector opening CA), and a Z-axis direction is an upper direction of the housing 3. A front-back direction, a horizontal direction and a vertical direction in the description below are based on the coordinates in FIG. 1.

The case 1 is a metal die-cast box having an aperture. It is recommended that the material of the die-cast box should be aluminum because aluminum is excellent in machinability, easy casting, accessibility, availability, etc. An example of the material is ADC12.

The case 1 includes a substantially rectangular bottom surface BA, two side surfaces SA1 substantially orthogonal to the bottom surface BA (substantially orthogonal to the aperture), a rear surface RA1 and the bracket BR. The case 1 stores the PCB 14 inside for protection. An electronic component 13 is mounted on the PCB 14 on a stage 12 formed like a stair from the bottom surface BA inside the case 1. The PCB 14 is disposed close to the metal case 1 so that heat released from the PCB 14 can be dissipated via the case 1. Moreover, due to the aperture, electronic components and PCBs can be arranged easily by fixing the PCBs by using screw holes 15 formed at four corners inside the case 1.

A side opposite to the rear surface RA1 is the connector opening CA. A connector (not illustrated) serving as an input-output part to/from the controlled object is disposed through the connector opening CA.

The case 1 includes two tab receivers 11 on each of the two side surfaces SA1. The tab receivers 11 are formed so as to project outward from the side surfaces SA1 of the case 1. An upper surface of each of the tab receivers 11 is obliquely tilted downward, like a hatched line, from the side surface SA1. A bottom surface of the tab receiver 11 is formed to be a plane surface (parallel to the bottom surface BA).

The lid 2 is formed to be a substantial rectangle so that the lid 2 closes the aperture of the case 1. The lid 2 is made from resin, such as polypropylene (PP). The lid 2 includes: an upper surface UA (main surface) that covers the aperture of the case 1 from above (Z direction and a first side); side surfaces SA2 that extend from an outer edge of the upper surface UA toward the side surfaces SA1 of the case 1; and a rear surface RA2 that extends from the outer edge of the upper surface UA toward the rear surface RA1. A side opposite to the rear surface RA2 is the connector opening CA.

Scales of the parts in the drawings may be changed in the description below as needed to show the parts in recognizable sizes.

<1-2. Structure>

Figure 2:
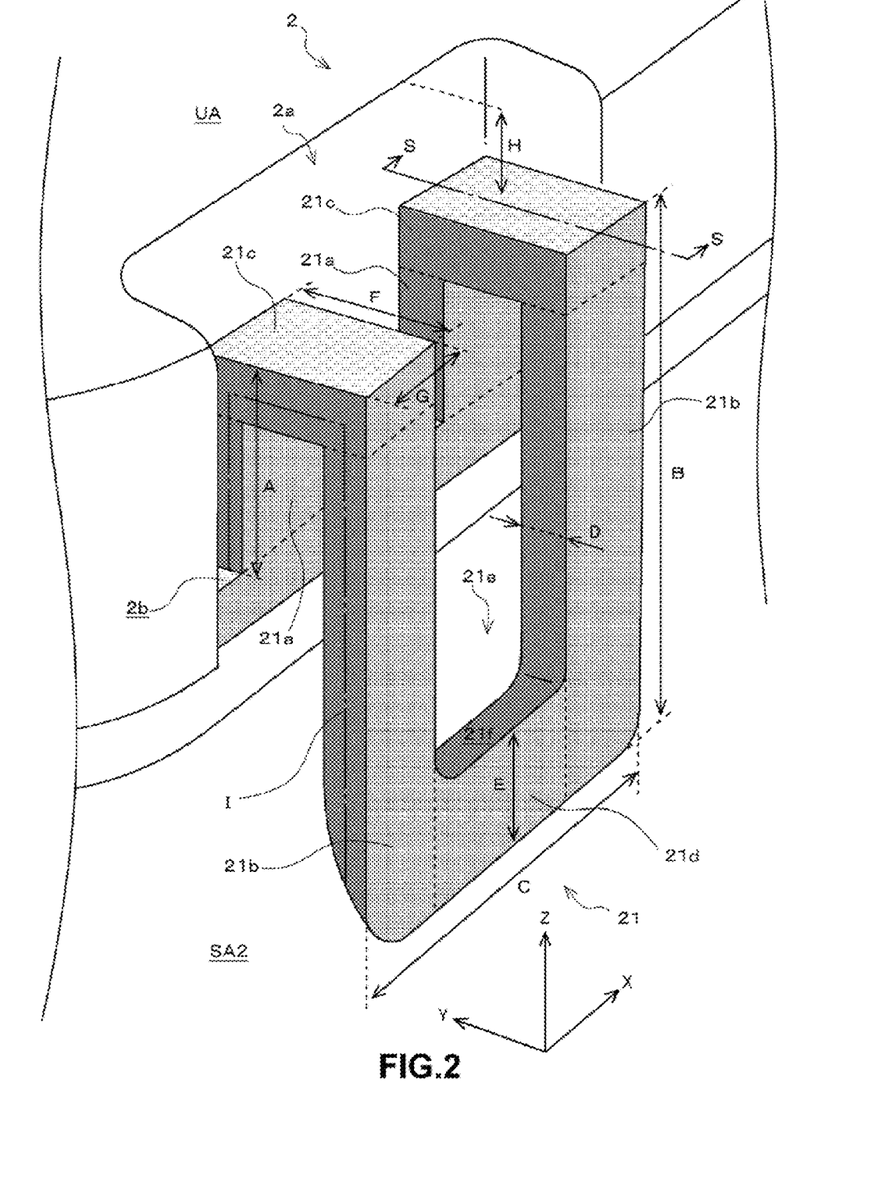
FIG. 2 illustrates a structure of an engaging tab.

FIG. 2 illustrates a perspective view showing a structure of an engaging tab 21 provided on the lid 2. The two engaging tab 21 are provided unitarily on each of the two side surfaces SA2 of the lid 2. When being detachably engaged with the tab receiver 11 of the case 1, force is generated to the engaging tab 21 and thus the case 1 and the lid 2 are fixed to each other tightly. In other words, when the engaging tab 21 is detachably engaged with the tab receiver 11, the engaging tab 21 is elastically deformed, and a portion near an open end of the engaging tab 21 that is a tip of the engaging tab 21 applies an upward (+Z side, the first side) force to the tab receiver 11. The engaging tab 21 includes a first tab portion 21a, a second tab portion 21b, a connecting portion 21c and a linking portion 21d. The engaging tab 21 includes two each of the first tab portion 21a, the second tab portion 21b and the connecting portion 21c.

A lower end portion (−Z side, a second side) of the first tab portion 21a of the engaging tab 21 is formed so as to be fixed to the lid 2 and to extend substantially orthogonal to the aperture of the case 1.

A lower end portion (−Z side, second side) of the second tab portion 21b of the engaging tab 21 is formed to be an open end not fixed to the lid 2 and extends substantially parallel to the first tab portion 21a.

The connecting portion 21c is formed so as to connect an upper end portion (+Z side) of the first tab portion 21a and an upper end portion (+Z side) of the second tab portion 21b. An upper surface of the connecting portion 21c is a plane. The upper surface of the connecting portion 21c is pressed by a person. Moreover, the connecting portion 21c is disposed lower (−Z side, second side) than the upper surface UA (main surface). In other words, the engaging tab 21 does not project upward (+Z side) higher than the upper surface UA.

The linking portion 21d connects portions near the open ends of the two second tab portions 21b. An inner area surrounded by the two first tab portions 21a, the two second tab portions 21b, the two connecting portion s21c and the linking portion 21d is an aperture 21e. An upper surface (surface on +Z side) of the linking portion 21d between the two second tab portions 21b is an inside surface 21f of the aperture 21e. The inside surface 21f of the aperture 21e is engaged with (gets caught on) the bottom surface of the tab receiver 11. Thus, the engaging tab 21 is engaged with the tab receiver 11. In a state in which the engaging tab 21 is engaged with the tab receiver 11, the engaging tab 21 is elastically deformed. Thus, the inside surface 21f of the aperture 21e applies the upward force (+Z side, the first side) to the tab receiver 11 by reaction force generated by deformation. The applied force fixes the case 1 and the lid 2 to each other tightly. Since the connecting portion 21c is pressed from above (+Z side, the first side) by the person, the engaging tab 21 is elastically deformed.

A shape formed by side surfaces (surfaces in the X-axis direction) of the first tab portion 21a, the second tab portion 21b and the connecting portion 21c (i.e., a side shape of the engaging tab 21) is deformed "square bracket"-shaped as shown by a substantial center line 1 of the side surfaces of those portions. Since the engaging tab 21 is deformed "square bracket"-shaped, the engaging tab 21 can be bent at plural points elastically so that when being pressed, the engaging tab 21 can be bent wholly. In other words, since the engaging tab 21 includes the first tab portions 21a, the second tab portions 21b and the connecting portions 21c, the entire engaging tab 21 can be easily bent elastically. Thus, as compared to a reversed "L"-shaped engaging tab, the engaging tab 21 is not easily broken.

The lid 2 includes a concavity 2a on the side surface SA2. The lower end portion (−Z side, second side) of the first tab portion 21a of the engaging tab 21 is fixed to an inside bottom surface (surface on the −Z side, surface of second side) of the concavity 2a. Since the first tab portion 21a is provided to the concavity 2a, the engaging tab 21 can be formed lower than the upper surface UA of the lid 2. Thus, since the first tab portion 21a is formed lower than the upper surface UA, even in a case where the upper surface UA is hit by an object, the engaging tab 21 does not come into contact with the object so that the engaging tab 21 is not released from the tab receiver 11. Moreover, since the first tab portion 21a is provided to the concavity 2a, a distance between the second tab portion 21b and the tab receiver 11 can be shorten. Therefore, since there is no need to form the second tab portion 21b to be long, the engaging tab 21 is not easily released from the tab receiver 11.

Next, dimensions of the engaging tab 21 are indicated below. However, the dimensions indicated below are examples. The dimensions of the engaging tab 21 are not limited to those figures below.

A length (Z-axis direction) A of the first tab portion 21a is 6.0 (mm). A length (Z-axis direction) B of the engaging tab 21 is 16 (mm) A width (X-axis direction) C of the engaging tab 21 is 14 (mm) A thickness (Y-axis direction) D of the engaging tab 21 is 1.2 (mm). A length (Z-axis direction) E of the linking portion 21d is 3.5 (mm). A length (Y-axis direction) F of the connecting portion 21c is 4.0 (mm). A width (X-axis direction) G of the connecting portion 21c is 3.5 (mm). A gap H between a top surface of the connecting portion 21c and a top surface of the lid 2 is 4.0 (mm).

<1-3. Engagement>

Figure 3:
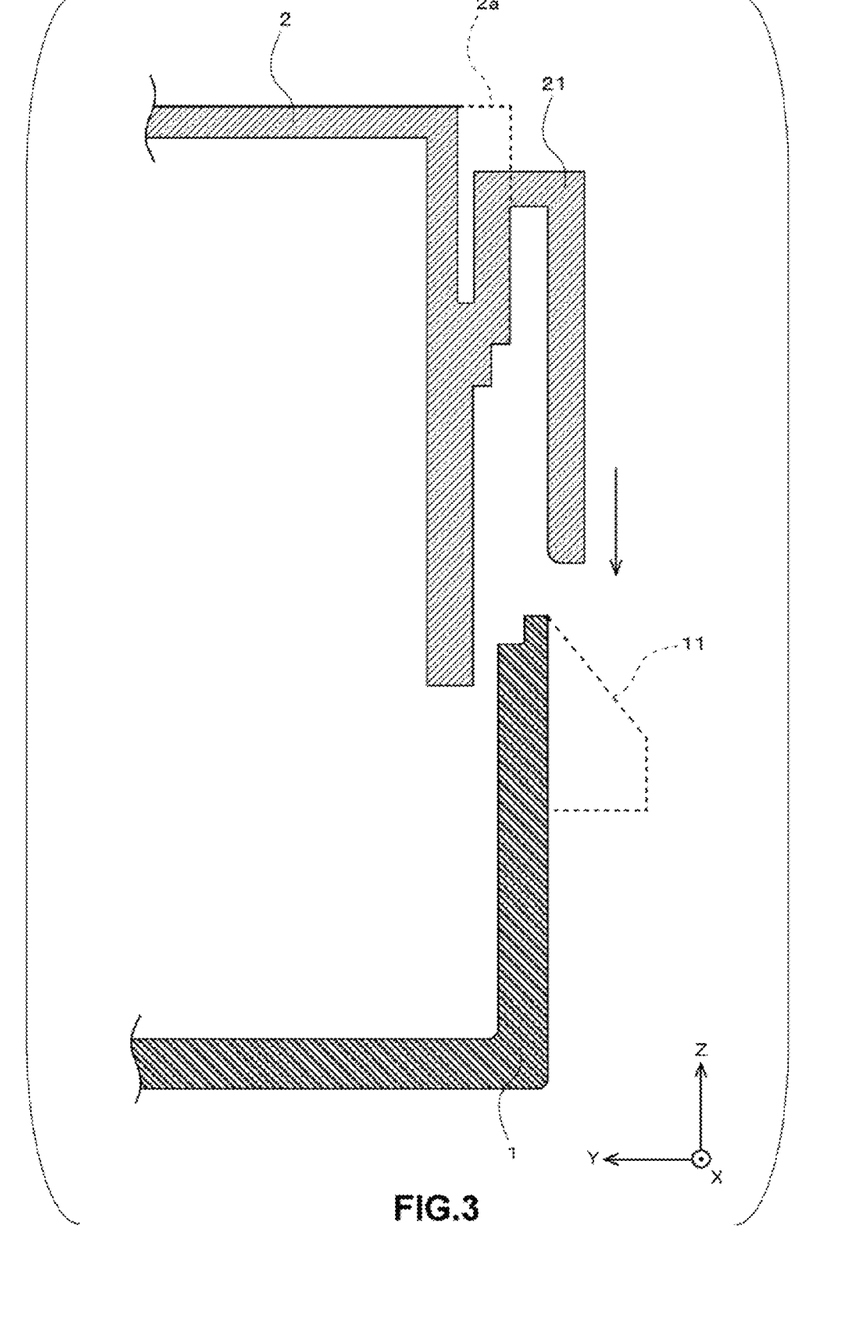
FIG. 3 illustrates an engaging tab getting engaged with a tab receiver.
Figure 4:
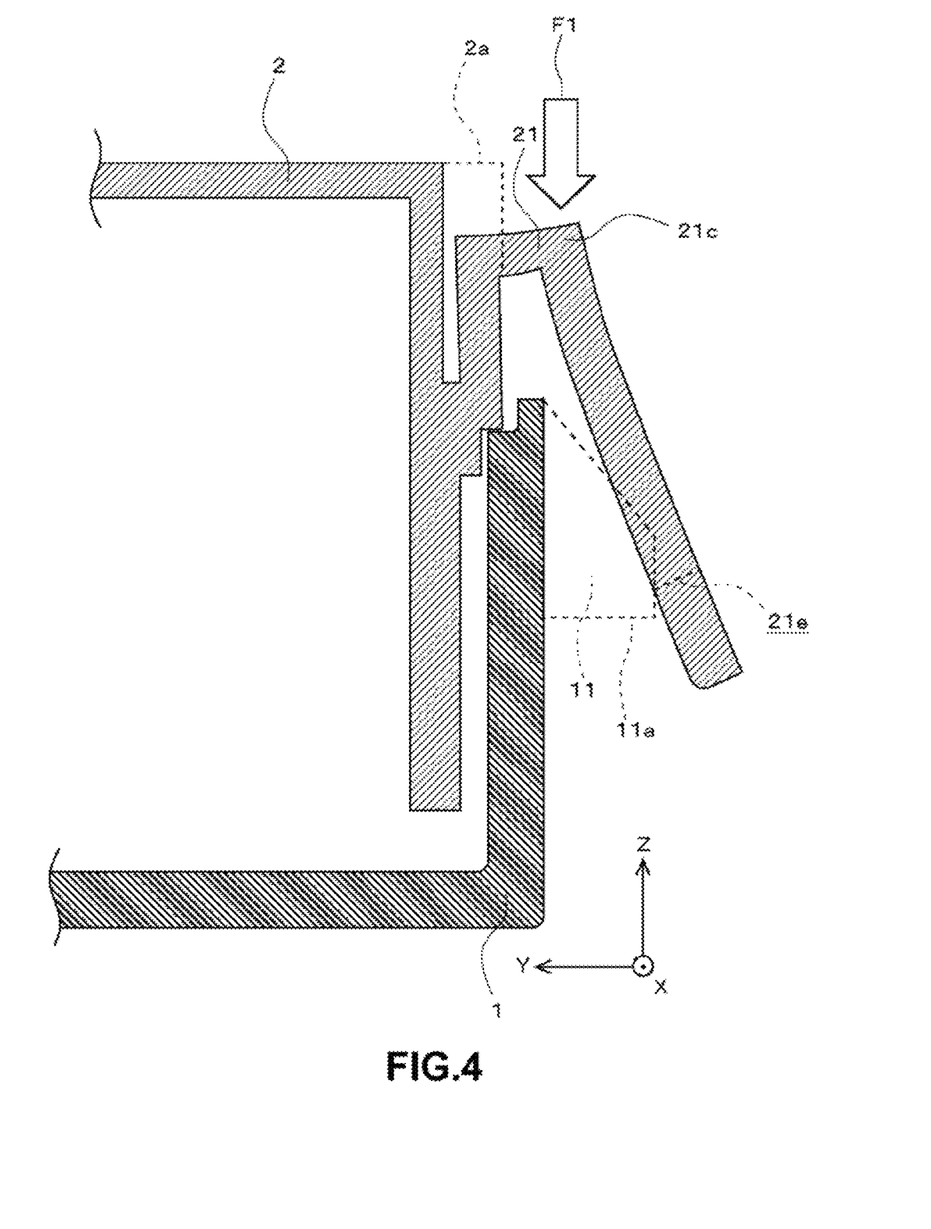
FIG. 4 illustrates the engaging tab getting engaged with the tab receiver.
Figure 5:
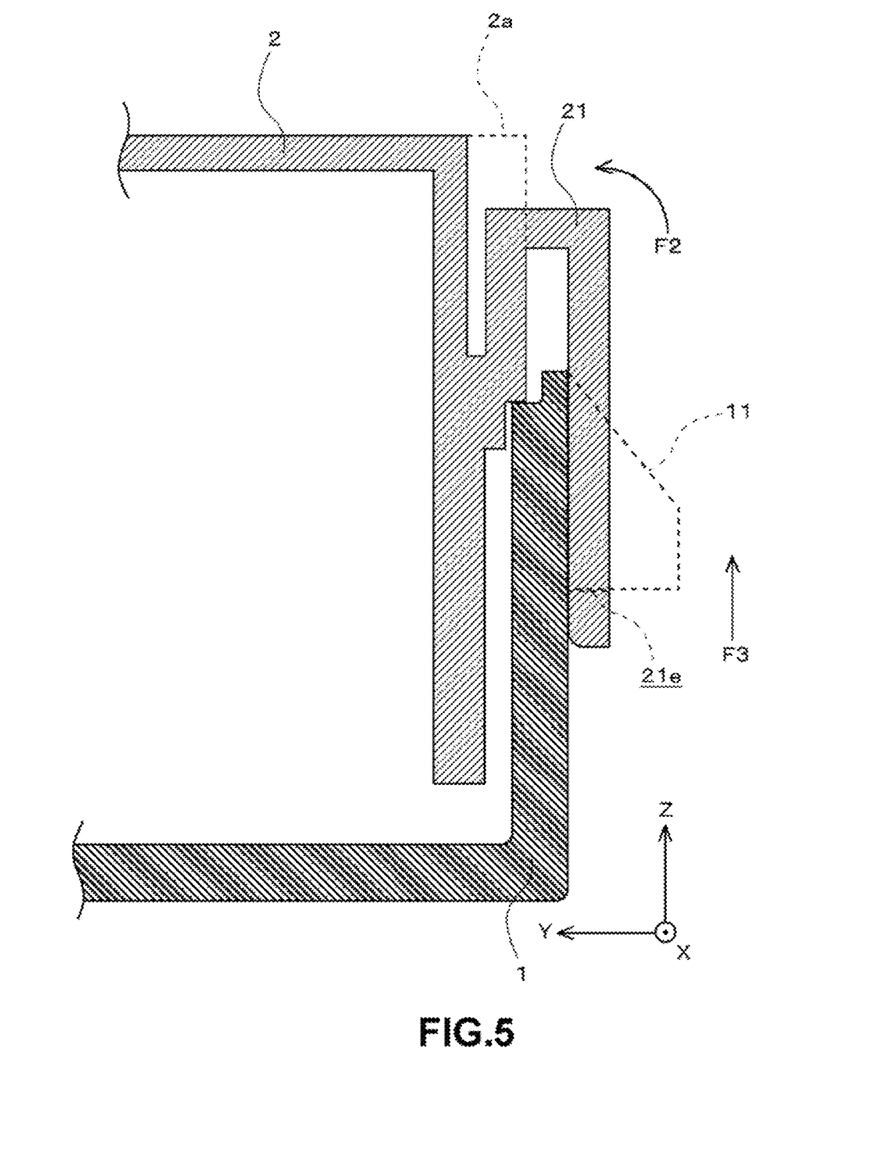
FIG. 5 illustrates the engaging tab getting engaged with the tab receiver.

FIGS. 3-5 illustrate, in order of time, states in which the engaging tab 21 is getting engaged with the tab receiver 11. Sectional views in FIGS. 3-5 and other drawings correspond to a sectional view along the line S-S in FIG. 2. For convenience of explanation, the tab receiver 11 not included in the sectional views is shown by a dotted line.

FIG. 3 illustrates a state in which the lid 2 is held above the case 1. The lid 2 held above the case 1 is moved in a lower (−Z) direction from the state in FIG. 3 and is engaged with the case 1. At this time, the tab receiver 11 of the case 1 is inserted between the side surface of the lid 2 and the engaging tab 21.

FIG. 4 illustrates a state in which the lid 2 is engaged with the case 1 but the engaging tab 21 of the lid 2 is not engaged with the tab receiver 11 of the case 1. When the lid 2 is moved in the lower direction from the state where the lid 2 is held above the case 1, the open end of the second tab portion 21b of the engaging tab 21 comes into contact with the tab receiver 11 of the case 1. When the lid 2 is moved further in the lower direction, the engaging tab 21 (the first tab portions 21a, the second tab portions 21b and the connecting portions 21c) is deformed (bent) elastically according to the shape of the tab receiver 11. In other words, the first tab portion 21a is slightly bent toward an outside (+Y side) of the lid 2 and the second tab portion 21b is bent toward an outside (−Y side) of the case 1. Moreover, the connecting portion 21c is slightly bent upward (+Z side). In this state, the inside surface 21f of the aperture 21e adjacent to the open end of the engaging tab 21 is got caught on a portion slightly higher than a bottom surface 11a (a surface on the −Z side of the tab receiver 11) of the tab receiver 11. Thus, since the inside surface 21f of the aperture 21e of the engaging tab 21 is caught on the tab receiver 11, the elastically deformed engaging tab 21 is not moved. In this state, when the upper surface of the connecting portion 21c is pressed in the lower direction with predetermined pressing force F1, the inside surface 21f of the aperture 21e is pressed downward to be under the tab receiver 11, and then the tab receiver 11 fits in the aperture 21e of the engaging tab 21. Thus, the engaging tab 21 is engaged with the tab receiver 11.

FIG. 5 illustrates a state in which the engaging tab 21 is engaged with the tab receiver 11. The engaging tab 21 is slightly bent downward elastically and thus the upward reaction force is generated by elastic deformation. In other words, the first tab portions 21a and the connecting portions 21c generate force F2 in the Y and Z directions that fixes the case 1 and the lid 2 to each other, and the second tab portions 21b generate force F3 in the Z direction. Therefore, the force F3 causes the inside surface 21f of the aperture 21e to press the tab receiver 11 upward (Z side) and thus the case 1 and the lid 2 are fixed to each other tightly. The force F3 generated to the engaging tab 21 fixes the case 1 and the lid 2 to each other tightly.

As described above, in the embodiment of the invention, the deformed "square bracket"-shaped engaging tab 21 provided on the case 1 is elastically deformed by pressing the engaging tab 21 so that the engaging tab 21 is engaged with the tab receiver 11 provided on the lid 2. Thus, the force is generated to the engaging tab 21 by the reaction force due to elastic deformation of the engaging tab 21. Thus, the case 1 and the lid 2 are fixed to each other tightly. Therefore, the force of the engaging tab 21 prevents the lid 2 from coming loose and also prevents looseness between the case 1 and the lid 2. Moreover, since the engaging tab 21 is the deformed "square bracket"-shaped, the engaging tab 21 can be bent elastically at plural points so that as compared to the conventional reversed "L"-shaped engaging tab, the engaging tab 21 is not easily broken because pressure is not concentrated on a root of the engaging tab 21.

2. Modifications

The embodiment of the invention is described above. However, the invention is not limited to the foregoing embodiment, but various modifications are possible. Some of those modifications are described below. Any form in the foregoing embodiments and the modifications described below may be arbitrarily combined with one another.

Figure 6:
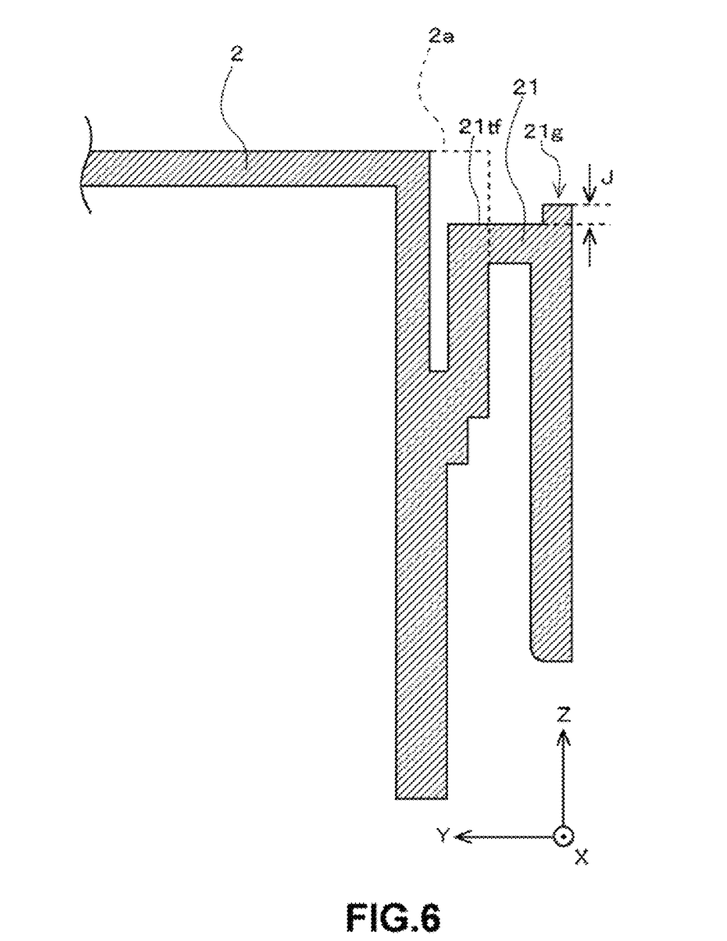
FIG. 6 illustrates an example of another engaging tab.

In the foregoing embodiment, the connecting portion 21c of the engaging tab 21 is pressed to engage the engaging tab 21 with the tab receiver 11. A projection may be provided on a position of the connecting portion 21c to be pressed. FIG. 6 illustrates a projection 21g provided on an upper surface 21tf of the connecting portion 21c. A height J of the projection 21g is in a range from 0.5 (mm) to 1.0 (mm). By providing the projection 21g on the upper surface 21tf of the connecting portion 21c, a person who presses the connecting portion 21c can see the position to be pressed and also can recognize the pressed position by a touch. Thus, the person clearly understands the location of the connecting portion 21c of the engaging tab 21 to be pressed to engage the engaging tab 21 with the tab receiver 11, and can press the location easily.

Figure 7:
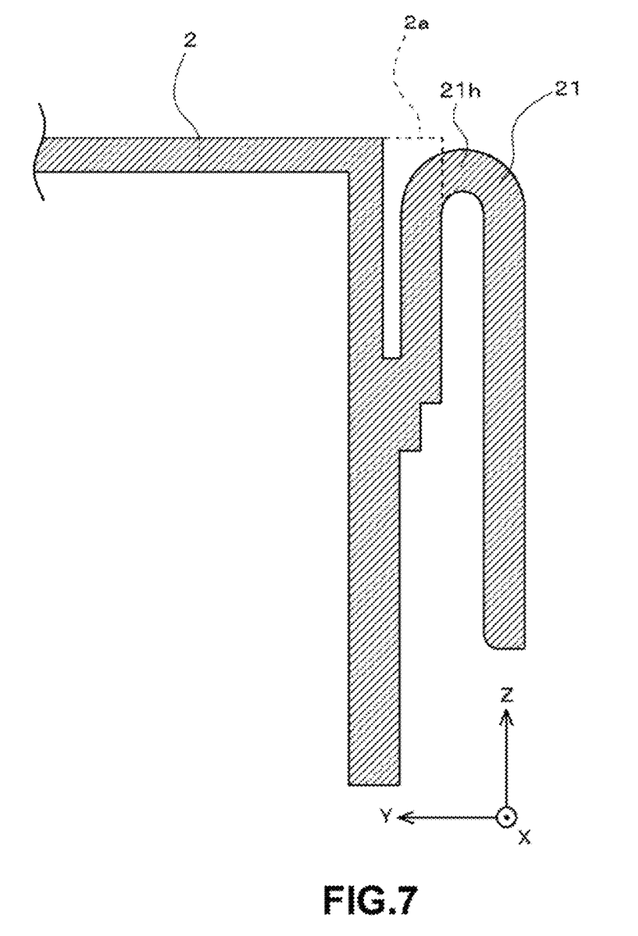
FIG. 7 illustrates an example of another engaging tab.

The connecting portion 21c in the foregoing embodiment may be changed to be curve-shaped, such as substantially semicircle. FIG. 7 illustrates a substantially semicircular connecting portion 21h. The connecting portion 21h connects the first tab portion 21a and the second tab portion 21b and is pressed by a person who presses the connecting portion 21h. In this case, the engaging tab 21 is a deformed "U"-shaped.

In the foregoing embodiment, the engaging tab 21 includes the aperture 21e. However, the engaging tab 21 may include a hook-shaped object that is engaged with the tab receiver 11, instead of the aperture 21e. In other words, the engaging tab 21 may be in any shape that can be engaged with the tab receiver 11.

In the foregoing embodiment, the aperture 21e provided to the engaging tab 21 is engaged with the tab receiver 11 provided on the case 1. However, a tab receiver may be provided on the engaging tab 21 and an aperture may be provided to the case 1. Shapes of the engaging tab 21 and the tab receiver 11 are not important as long as the case 1 and the lid 2 are fixed to each other by reaction force caused by the elastically deformed engaging tab 21.

In the foregoing embodiment, the material of the lid 2 is polypropylene (PP). However, another material may be used for the lid 2. For example, plastic or nylon may be used. However, thermoplastic resin is recommended. In other words, a material of the lid 2 may be anything that is bendable elastically when being pressed and thus that generates force.

While the invention has been shown and described in detail, the foregoing description is in all aspects illustrative and not restrictive. It is therefore understood that numerous other modifications and variations can be devised without departing from the scope of the invention.

What is claimed is:

1. A fixing structure comprising:
    a case having an aperture on a first side of the case;
    a lid configured to cover the aperture;
    an engaging tab provided on the lid; and
    a tab receiver that detachably engages with the engaging tab, the tab receiver provided on a surface of the case that is substantially orthogonal to the aperture of the case, wherein
    the engaging tab includes:
        a first portion having a first end fixed to the lid, the first portion extending substantially orthogonal to the aperture of the case to a second end of the first portion;

a second portion having a first end that is spaced from and not fixed to the lid, the second portion extending substantially parallel to the first portion to a second end of the second portion, and the second portion comprising two tab portions separated by an aperture, a linking portion linking the two tab portions, wherein an upper surface of the linking portion defines an inside surface of the aperture, and wherein in a state where the engaging tab and the tab receiver are engaged with each other, the inside surface of the aperture is engaged with a bottom surface of the tab receiver; and a connecting portion that connects the second end of the first portion to the second end of the second portion, wherein in the state where the engaging tab and the tab receiver are engaged with each other, the engaging tab is elastically deformed and thus the first end of the second portion applies a force to the tab receiver, the force applied toward the first side of the case.

2. The fixing structure according to claim 1, wherein
in the state where the engaging tab and the tab receiver are engaged with each other, the inside surface of the aperture adjacent to the first end of the second portion applies the force to the tab receiver.

3. The fixing structure according to claim 2, wherein
the engaging tab is elastically deformed when the connecting portion is pressed toward the first side of the case.

4. The fixing structure according to claim 1, wherein
the lid includes a main surface that covers the aperture of the case, a side surface substantially orthogonal to the main surface, and a concavity in the side surface, and
the first end of the first portion is fixed to an inside surface of the concavity of the lid.

5. The fixing structure according to claim 4, wherein
an upper surface of the connecting portion is below the main surface of the lid so that the upper surface of the connecting portion does not protrude above the main surface of the lid.

6. The fixing structure according to claim 1, wherein
the lid and the engaging tab are a unitary structure of a synthetic resin.

7. The fixing structure according to claim 1, wherein
the case is a metal case.

8. The fixing structure according to claim 1, wherein
in the state where the engaging tab and the tab receiver are engaged with each other, an entirety of a bottom surface of the connecting portion is spaced apart from a top surface of the tab receiver.

* * * * *